(12) United States Patent
Hernandez Blasco et al.

(10) Patent No.: US 10,116,300 B2
(45) Date of Patent: Oct. 30, 2018

(54) SWITCHING COMPONENT, IN PARTICULAR DOMESTIC-APPLIANCE SWITCHING COMPONENT

(71) Applicant: BSH Hausgeräte GmbH, Munich (DE)

(72) Inventors: Pablo Jesus Hernandez Blasco, Cuarte de Huerva (ES); Sergio Llorente Gil, Zaragoza (ES); Oscar Lucia Gil, Zaragoza (ES); Arturo Mediano Heredia, Zaragoza (ES); Daniel Palacios Tomas, Zaragoza (ES); Hector Sarnago Andia, Olvega (ES)

(73) Assignee: BSH Hausgeräte GmbH, Munich (DE)

( * ) Notice: Subject to any disclaimer, the term of this patent is extended or adjusted under 35 U.S.C. 154(b) by 526 days.

(21) Appl. No.: 14/647,454

(22) PCT Filed: Dec. 9, 2013

(86) PCT No.: PCT/IB2013/060745
§ 371 (c)(1),
(2) Date: May 27, 2015

(87) PCT Pub. No.: WO2014/091389
PCT Pub. Date: Jun. 19, 2014

(65) Prior Publication Data
US 2015/0303916 A1    Oct. 22, 2015

(30) Foreign Application Priority Data
Dec. 14, 2012   (ES) .................................. 201231939

(51) Int. Cl.
*H03K 17/687* (2006.01)
*H03K 17/0412* (2006.01)
(Continued)

(52) U.S. Cl.
CPC ..... *H03K 17/687* (2013.01); *H03K 17/04123* (2013.01); *H03K 17/102* (2013.01);
(Continued)

(58) Field of Classification Search
CPC ............... H03K 17/687; H03K 17/102; H03K 17/04123; H03K 17/74; H03K 2017/066; H05B 6/1236
See application file for complete search history.

(56) References Cited

U.S. PATENT DOCUMENTS 4,487,457 A * 12/1984 Janutka ............ H03K 17/04123
327/404
4,801,822 A * 1/1989 Idaka ............... H03K 17/04123
250/551
(Continued)

FOREIGN PATENT DOCUMENTS

DE    102009054582 A1 *  6/2010  ............ F24C 15/106
EP    1061580 A2          12/2000
JP    2002299028 A        10/2002

OTHER PUBLICATIONS

International Search Report PCT/IB2013/060745 dated May 27, 2014.
National Search Report EP 201231939 dated Dec. 14, 2012.

*Primary Examiner* — Jared Fureman
*Assistant Examiner* — Michael Warmflash
(74) *Attorney, Agent, or Firm* — Michael E. Tschupp; Andre Pallapies; Brandon G. Braun

(57) ABSTRACT

A switching component, in particular a domestic-appliance switching component, includes a series circuit of at least two field effect transistors, and at least one driver circuit, which is associated with one of the at least two field effect transistors. The driver circuit has at least one switching
(Continued)

element, which short circuits two control contacts of the field effect transistor in at least one operating state.

19 Claims, 3 Drawing Sheets

(51) Int. Cl.
*H03K 17/10* (2006.01)
*H03K 17/74* (2006.01)
*H05B 6/12* (2006.01)
*H03K 17/06* (2006.01)

(52) U.S. Cl.
CPC ........... *H03K 17/74* (2013.01); *H05B 6/1236* (2013.01); *H03K 2017/066* (2013.01)

(56) References Cited

U.S. PATENT DOCUMENTS

| | | | | |
|---|---|---|---|---|
| 5,148,064 | A * | 9/1992 | Kevorkian | H03K 17/102 327/427 |
| 6,661,276 | B1 * | 12/2003 | Chang | H03K 17/04123 327/427 |
| 7,187,227 | B2 * | 3/2007 | Umeda | H03K 17/04123 327/399 |
| 2009/0251198 | A1 * | 10/2009 | Rudolph | H03K 17/04123 327/482 |
| 2010/0119668 | A1 * | 5/2010 | Maupin | A47J 27/004 426/237 |
| 2011/0163086 | A1 * | 7/2011 | Aldana Arjol | H05B 6/065 219/622 |

* cited by examiner

SWITCHING COMPONENT, IN PARTICULAR DOMESTIC-APPLIANCE SWITCHING COMPONENT

BACKGROUND OF THE INVENTION

The invention is based on a switching component according to the preamble of claim 1.

Switching components formed by a series circuit of MOSFETs and having a driver circuit are known. The known driver circuits each have a resistor or a Zener diode, which is connected between control contacts of the respective MOSFET.

BRIEF SUMMARY OF THE INVENTION

It is the object of the invention in particular to provide a generic apparatus with improved properties with regard to fast switch-off behavior and economical design. According to the invention the object is achieved by the features of the independent claim, while advantageous embodiments and developments of the invention will emerge from the subclaims.

The invention is based on a switching component, in particular a domestic appliance switching component, which has a series circuit of at least two, advantageously at least three, preferably at least four, in particular at least eight, also conceivably at least twelve, field effect transistors and at least one driver circuit, which is associated with one of the at least two field effect transistors.

It is proposed that the driver circuit has at least one switching element, which short circuits two control contacts of the field effect transistor in at least one operating state. In particular the switching component has a number of driver circuits, which corresponds at least essentially, in particular at least 50%, in particular at least 80%, advantageously up to one, preferably exactly, to the number of field effect transistors connected in series, with each of the driver circuits advantageously being associated solely with just one of the field effect transistors. A switching component here refers in particular to an electronic component, which has two control contacts and two power contacts, it being provided to set a conductivity between the two power contacts as a function of an activation signal between the two control contacts. In particular one of the control contacts and one of the power contacts are connected at least in a conducting manner to one another, preferably being short circuited, and in particular form an individual technically contactable contact. Alternatively it is conceivable for the control contacts and the power contacts to be separately contactable. In particular the switching contact is provided to carry a blocking voltage of at least 300 V, in particular at least 450 V, advantageously at least 600 V, by way of the power contacts in a stable manner in at least a first operating state. In particular the switching component is provided to carry a power current of at least 1 A, in particular at least 3 A, advantageously at least 10 A, preferably at least 15 A, by way of the power contacts, preferably in a stable manner, in at least a second operating state. The field effect transistor advantageously has two power contacts and two control contacts, it being provided to set a conductivity between the power contacts as a function of a control voltage present between the control contacts. One of the control contacts and one of the power contacts of the field effect transistor are advantageously connected internally at least in a conductive manner, in particular being short circuited, alternatively being separately contactable. In particular the field effect transistors have dielectric strengths such that a sum of the dielectric strengths of the field effect transistors connected in series corresponds to the blocking voltage of the switching component. A series circuit of field effect transistors refers in particular to a series circuit along the power contacts of the field effect transistors. In particular the switching component has two field effect transistors, which each have a power contact which forms a power contact of the switching component. Electrons are preferably the majority charge carriers of the field effect transistors connected in series, in particular because of the better charge carrier mobility. The field effect transistors connected in series are advantageously of the standard blocking type. The field effect transistors connected in series are preferably of the same activation type. The switching component is preferably of the standard blocking type. In particular it is conceivable for the switching component to be of a different activation type from the transistors connected in series. A standard blocking type means in particular that if there is no or a negligible electrical signal, in particular no or a negligible voltage, present, the field effect transistor and/or the switching component break(s) a connection between its/their power contacts. A driver circuit refers in particular to an electronics module arranged between control contacts of different field effect transistors. In particular the driver circuit is provided to bring about a switching on and/or switching off of the associated field effect transistor as a function of an input signal. In particular the driver circuit has at least two contacts, which are connected to different control contacts of the associated field effect transistor. A switching element refers in particular to an electrical component which has at least two control contacts and at least two power contacts, with one of the control contacts and one of the power contacts advantageously being connected internally at least in a conducting manner to one another, preferably being short circuited, and with the switching element being provided to set a conductivity between the power contacts as a function of an electrical signal between the control contacts. When it is conducting, the switching element preferably has a voltage drop amounting to less than 0.5 V, in particular less than 0.2 V, preferably less than 0.05 V, between the power contacts. In particular the switching element is provided to connect the control contacts of the field effect transistor by way of the power contacts of the switching element, with in particular the power contacts of the switching element being connected respectively to a control contact of the field effect transistor, preferably directly. In particular the switching element is configured as a transistor, advantageously as a field effect transistor, preferably as a MOSFET. Other switching elements known to the person skilled in the art, in particular JFET, MISFET, CNTFET and HEMT, are also conceivable. Majority charge carriers of the field effect transistors connected in series and of the switching element of the driver circuit are preferably different. Provided here means in particular specifically programmed, designed and/or equipped.

The inventive design in particular allows fast switch-off behavior to be achieved. By short circuiting the control contacts of the field effect transistors by means of the switching element it is possible to bring about a particularly fast reduction of a voltage present between the control contacts and activating the field effect transistor. Activation and deactivation of the field effect transistor can also be achieved by economical means.

The at least two field effect transistors are advantageously configured as MOSFETs. It is possible in particular to achieve an efficient and/or economical design.

It is further proposed that the driver circuit has at least one Zener diode, which is arranged between the control contacts of the switching element. In particular the Zener diode has a breakdown voltage, in particular at least 3 V, advantageously at least 10 V, preferably at least 15 V, advantageously maximum 25 V, which corresponds as a maximum to a value corresponding to the control voltage of the apparatus. A breakdown voltage of the Zener diode preferably corresponds at least to a switching voltage of the switching element. In particular when the switching component is deactivated, the Zener diode supplies an electrical signal that activates the switching element. In particular when the switching component is deactivated charge flows through the Zener diode in the blocking direction, said charge being stored on a control contact of the field effect transistor, generating a voltage drop across the control contacts of the switching element. In particular the Zener diode is arranged in such a manner that charge carriers flow through it in the throughflow direction when the associated field effect transistor is switched on. It is possible in particular to achieve a high level of reliability. In particular an adequate, precisely defined and/or continuous switching voltage can be supplied for the switching element. It is further proposed that the driver circuit has at least one protective diode, which reduces a voltage drop, in particular originating from power contacts of the switching component, by way of the assigned field effect transistor and/or the switching element when at least one of the field effect transistors is switched off. In particular the protective diode has a blocking voltage, which corresponds at least essentially to a blocking voltage of the switching component, in particular at least 300 V, advantageously at least 450 V, preferably at least 600 V. In particular a contact of the protective diode forms a signal input of the driver circuit. The protective diode and the Zener diode are advantageously connected in series, preferably rectifying in the same direction, with the Zener diode preferably being arranged between the protective diode and the field effect transistor. An anode of the one diode is preferably connected directly to a cathode of the other diode. The driver circuit advantageously has an isolation capacitance, in particular in the form of an individual capacitor, which is arranged parallel to the protective diode. In particular the isolation capacitance has a voltage impedance which corresponds at least to the blocking impedance of the protective diode. In particular it is possible for the Zener diode to become conducting upstream of the protective diode when the switching component is switched on, which in particular allows a fast switch-on operation. In particular the isolation capacitance has a capacitance which corresponds to 0.001 times to 100 times a parasitic capacitance of the Zener diode. In particular the isolation capacitance has a value between 10 pF and 10 nF.

It is further proposed that the switching component has at least one main driver, which applies at least an electrical signal, in particular at least a voltage, in particular a voltage greater than 0 V, in particular greater than 1 V, advantageously greater than 10 V, preferably greater than 15 V, and in particular smaller than 25 V, advantageously smaller than 20 V, at least to the one driver circuit, preferably to each of the driver circuits, in at least one operating state. In particular input contacts of the driver circuits are connected to one another, being advantageously at the same time connected directly to an output contact of the main driver. In particular the main driver has at least one activation step (DRIVER), which converts a control signal, sent in particular from a control unit, to an output value so that a potential at the output contact of the main driver deviates more than 0 V, in particular more than 1 V, advantageously more than 5 V, preferably more than 15 V, and in particular less than 25 V, advantageously less than 20 V, from a potential at one of the power contacts, in particular the power contact of the switching component which is connected directly to a control contact of one of the field effect transistors, preferably being greater than the potential of said power contact.

It is advantageously proposed that the elements of the driver circuit and/or the field effect transistors are configured as separate components. By configuring the field effect transistors as separate components it is possible in particular to achieve a low cooling outlay even if large currents are switched. In particular a cooling arrangement of the switching module has a thermal resistance of at least 10 K/W, in particular at least 20 K/W, advantageously at least 50 K/W, preferably at least 80 K/W. In particular the cooling arrangement is formed by the field effect transistors, or their component housings, per se. In particular there is no need for an additional cooling element and/or fan, thereby allowing space, in particular headroom, to be saved. A cost saving can also be achieved. In particular the at least one driver circuit is also formed from individual components, which are arranged in an appropriate manner on an electronics board. Alternatively it is conceivable for at least the one driver circuit to be configured as an integrated component. As the driver circuit per se has no heat losses, it is possible to save a great deal of space in this manner. In a further embodiment it is also conceivable for the field effect transistors and in particular also the driver circuits to form an individual integrated circuit, as a result of which even though the effective cooling properties that can be achieved with separate components may be lost, it is possible to save space.

The invention is particularly advantageously used in a domestic appliance with a domestic appliance apparatus, in particular a cooktop apparatus, preferably in an induction cooktop apparatus, alternatively in an oven apparatus, in particular an induction oven apparatus, which has at least one inventive switching component. It is possible in particular to achieve a structure requiring little space for electronics. The switching component is preferably part of an inverter, advantageously of an induction heating circuit, allowing in particular electrically efficient embodiments to be achieved. In particular an inventive embodiment of an induction heating circuit can allow operation at frequencies significantly above 100 kHz, with acceptable power losses.

Further advantages will emerge from the description of the drawing which follows. The drawing shows an exemplary embodiment of the invention. The drawing, description and claims contain numerous features in combination. The person skilled in the art will expediently also consider the features individually and combine then to form useful further combinations.

DETAILED DESCRIPTION OF EXEMPLARY EMBODIMENTS OF THE PRESENT INVENTION

Figure 1:
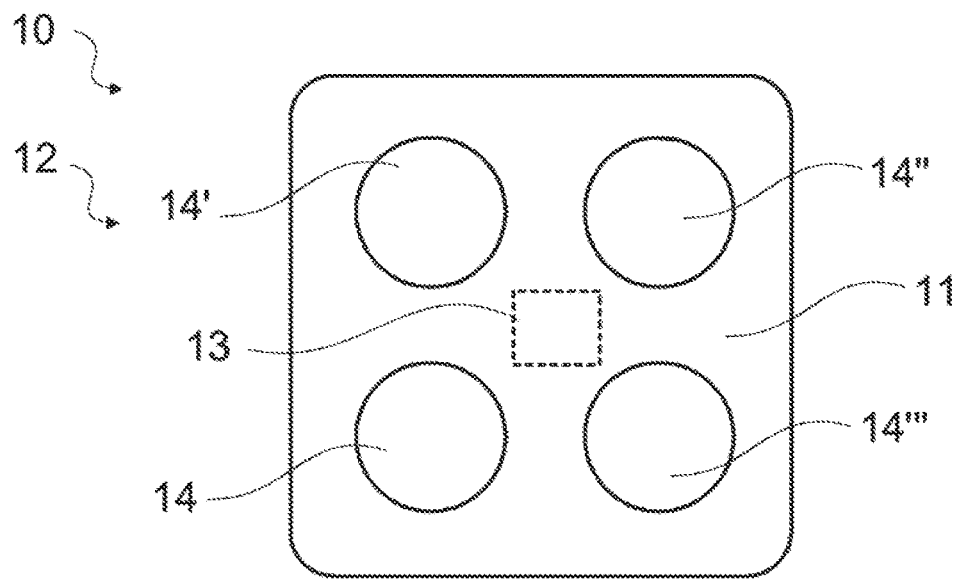
FIG. 1 shows a schematic diagram of an inventive cooktop viewed from above.

FIG. 1 shows a domestic appliance 10 configured as an induction cooktop, with a domestic appliance apparatus 12 configured as an induction cooktop apparatus. The domestic appliance apparatus 12 has four heating elements 14, 14', 14'', 14'''. The heating elements 14, 14', 14'', 14''' are configured as inductors. The heating elements 14, 14', 14'', 14''' are arranged below a cooktop plate 11 of the domestic appliance apparatus 12. The domestic appliance apparatus 12 also has supply circuits 13 configured as induction heating circuits to supply the heating elements 14, 14', 14'', 14'''.

Figure 2:
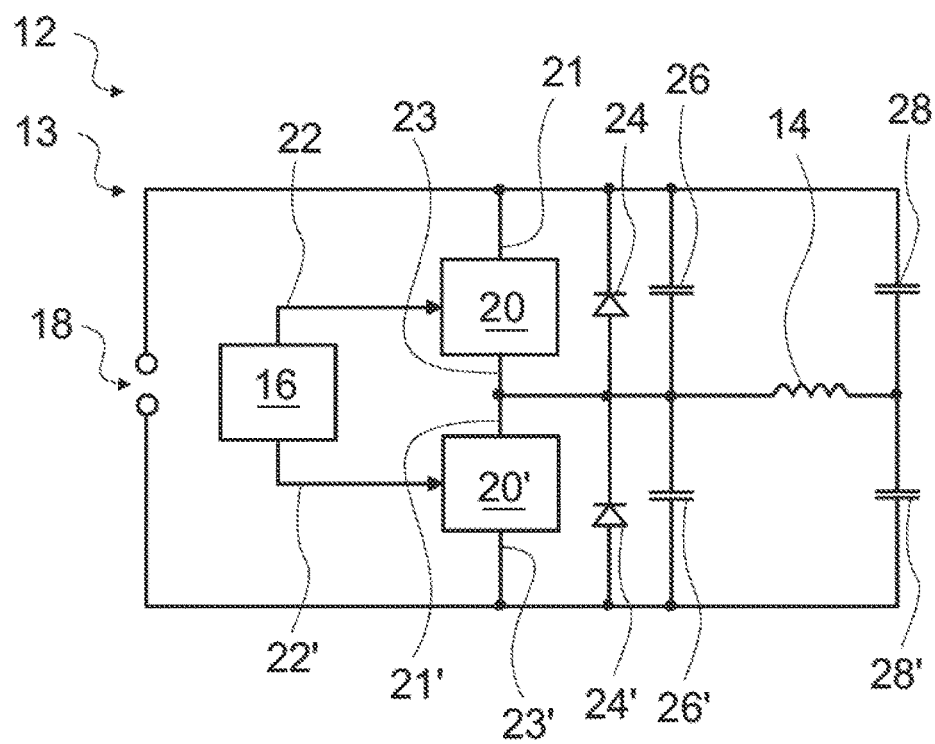
FIG. 2 shows a schematic circuit diagram if an inventive cooktop apparatus.

FIG. 2 shows the domestic appliance apparatus 12 using the example of the heating element 14, which is supplied by the supply circuit 13 in an operating state. The other heating elements 14', 14'', 14''' are arranged in similar supply circuits 13. The supply circuit 13 has an energy supply 18. The energy supply 18 has rectifier unit and a buffer capacitance. The energy supply 18 also has a filter unit. The supply circuit 13 has two inventive switching components 20, 20'. The switching components 20, 20' are configured as domestic appliance switching components, more specifically cooktop switching components. The supply circuit 13 has a half bridge-type circuit with the heating element 14 arranged in a bridge branch. The two switching components 20, 20' are connected in series between poles of the energy supply 18. A first power contact 21 of the first switching component 20 is connected to a positive pole of the energy supply 18. A second power contact 23 of the first switching component 20 is connected to a first power contact 21' of the second switching component 20' and forms a center tap. A second power contact 23' of the second switching component 20' is connected to a negative pole of the energy supply 18. Connected to the center tap between the switching components 20, 20' is a first contact of the heating element 14. Connected parallel to each of the switching components 20, 20' is a freewheeling diode 24, 24', the cathode of the freewheeling diode 24, 24' being connected to the positive pole of the energy supply 18 and its anode being connected to the negative pole of the energy supply 18.

Figure 4:
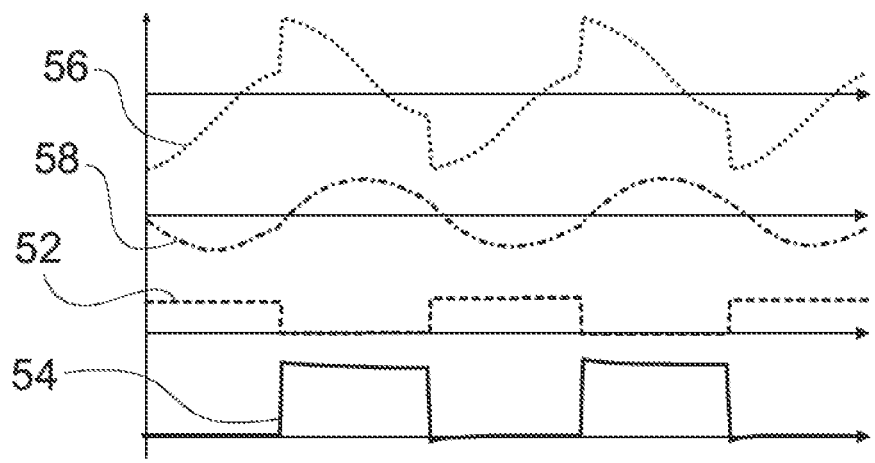
FIG. 4 shows a schematic diagram of an operating sequence of the inventive cooktop apparatus according to FIG. 2

The supply circuit also has a snubber capacitance 26, 26' connected parallel to the switching components 20, 20' in each instance. The supply circuit 13 also has a resonance unit, to which a second contact of the hearing element 14 is connected. The resonance unit is formed by two resonance capacitances 28, 28' which are connected in series between the poles of the energy supply 18. A center tap between the resonance capacitances 28, 28' is connected to the second contact of the heating element 14. Alternatively it is conceivable for the resonance unit to have only one resonance capacitance 28, 28', which is connected between the second contact of the heating element 14 and one of the poles of the energy supply 18. The supply circuit 13 also has a control unit 16, which is provided to activate the switching components 20, 20' by way of activation lines 22, 22' in various operating modes. The control unit 16 is provided to activate the switching components 20, 20' alternately in order to generate a high-frequency AC voltage with a frequency between 20 kHz and 500 kHz across the center tap. The control unit 16 generates control signals 52, which are converted in the switching component 20 to a voltage of 0 V or 16 V (FIG. 4). In accordance with the control signals 52 the switching component 20 blocks a voltage 54 present between its power contacts 21, 23 when the control signal 52 is inactive or establishes a conducting connection between the power contacts 21, 23. Alternating activation of the switching components 20, 20' results in a periodic voltage profile 56 and a periodic current profile 58 across the heating element 14.

Embodiments are also conceivable in which a one-switch topology is used to supply the heating element 14, having only one inventive switching component 20, 20'. Embodiments are also conceivable in which a full bridge-type topology with four inventive switching components is used to supply the heating element 14. Further supply circuits are conceivable which are preferably used to supply a heating element and have at least one inventive switching component.

Figure 3:
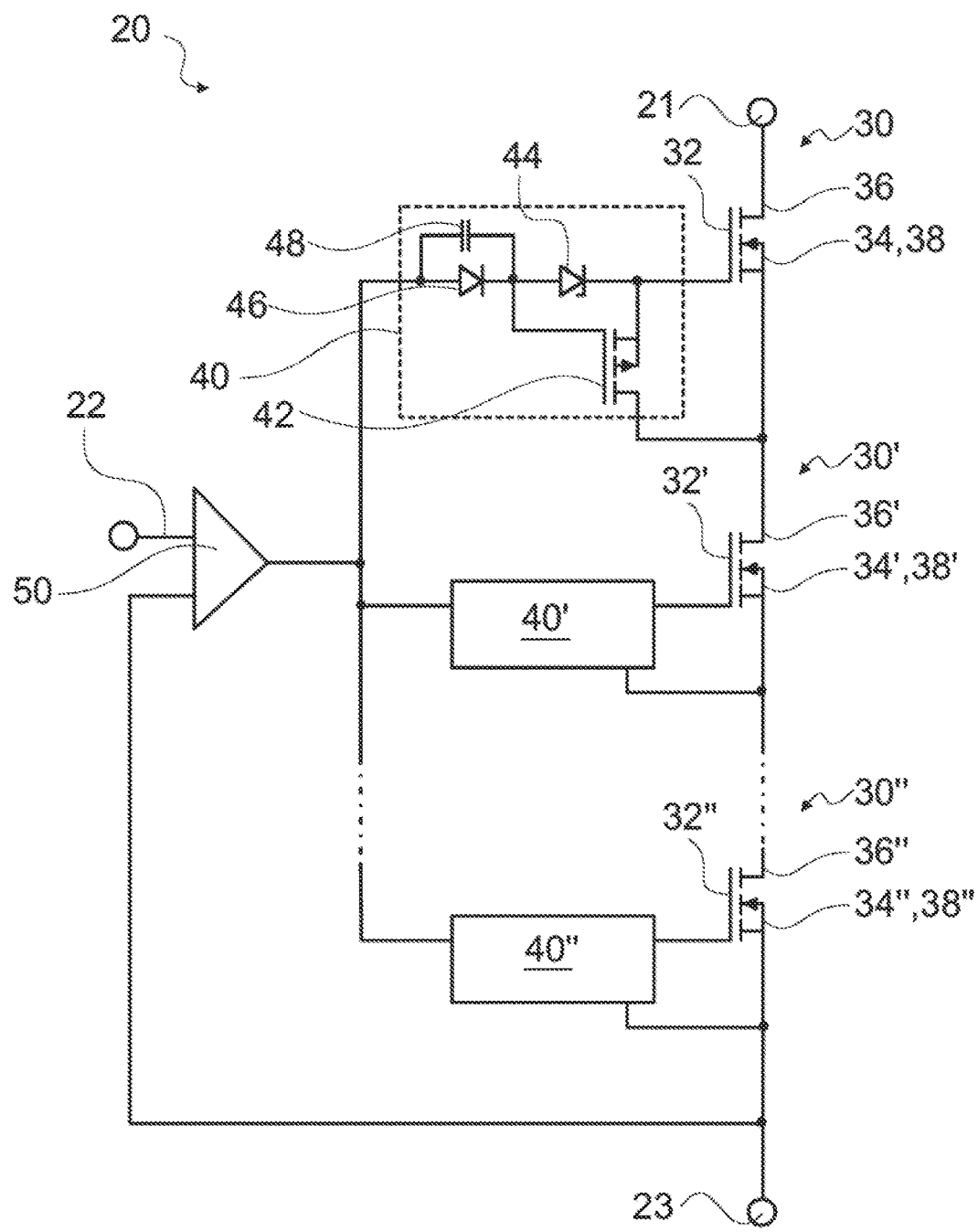
FIG. 3 shows a schematic diagram of an inventive switching element.

FIG. 3 shows the switching component 20. The switching component 20 has a series circuit of 16 field effect transistors 30, 30', 30''. The field effect transistors 30, 30', 30'' are configured as MOSFETs. The field effect transistors 30, 30', 30'' each have a dielectric strength of 30 V. This results in a dielectric strength of 480 V for the switching component 20. The switching component 20 also has a driver circuit 40, 40', 40'' for each of the field effect transistors 30, 30', 30'', this being associated with the corresponding field effect transistor 30, 30', 30''. The field effect transistors 30, 30', 30'' each have two power contacts 36, 36', 36'', 38, 38', 38'' and two control contacts 32, 32', 32'', 34, 34', 34''. The field effect transistors 30, 30', 30'' each have negative majority charge carriers. A first power contact 36 of a first of the field effect transistors 30 forms a first power contact 21 of the switching component 20. A second power contact 38'' of a last of the field effect transistors 30'' forms a second power contact 23 of the switching component 20. The first power contacts 36' of the further field effect transistors 30' are each connected to a second power contact 38, 38' of a directly preceding field effect transistor 30, 30'. The second power contacts 38' of the further field effect transistors 30' are each connected to a first power contact 36', 36'' of a directly following field effect transistor 30', 30''. A second of the control contacts 34, 34', 34'' and a second of the power contacts 38, 38', 38'' of the field effect transistors 30, 30', 30'' are each connected directly so that the field effect transistors 30, 30', 30'' technically only have three contacts.

The identically structured driver circuits 40, 40', 40'' are described in the following using the example of the driver circuit 40. The driver circuit 40 has a switching element 42, which short circuits the two control contacts 32, 34 of the corresponding field effect transistor 30 at least during a switch-off operation. A first power contact of the switching element 42 is connected directly to the first control contact 32 of the field effect transistor 30. A second power contact of the switching element 42 is connected directly to the second control contact 34 of the field effect transistor 30. The second control contact of the switching element 42 is therefore also connected to the second power contact 38 of the field effect transistor 30. The switching element 42 is configured as a field effect transistor and in particular as a MOSFET. The switching element 42 has positive majority charge carriers. A first power contact of the switching element 42 is connected directly to the second control contact of the switching element 42. The switching element 42 has a dielectric strength of 20 V.

The driver circuit 40 also has a Zener diode 44, which is arranged between control contacts of the switching element 42. The Zener diode 44 is connected directly to the first control contact 32 of the field effect transistor 30. The Zener diode 44 has a breakdown voltage of 10 V. The cathode of the Zener diode 44 is connected directly to the first control contact 32 of the field effect transistor 30.

The driver circuit 40 also has a protective diode 46. The protective diode 46 has a dielectric strength of 500 V. Its high dielectric strength means that the protective diode 46 prevents the field effect transistor 30 being breached across the driver circuit 40. A voltage drop across the associated field effect transistor 30 is reduced when the switching component 20 is switched off, in other words when the control signal 52 is inactive. The protective diode 46 and the Zener diode 44 are connected in series. A cathode of the protective diode 46 is connected directly to an anode of the Zener diode 44. The first control contact of the switching element 42 is connected both to the Zener diode 44 and to the protective diode 46. The first control contact of the switching element 42 is connected directly to the anode of the Zener diode and the cathode of the protective diode 46. The second control contact of the switching element 42 is connected directly to the cathode of the Zener diode 44.

The driver circuit 40 also has an isolation capacitance 48, which is connected parallel to the protective diode 46. A contact of the protective diode 46 facing away from the Zener diode 44 forms a signal input of the driver circuit 40. Voltage changes at the signal input are introduced into the driver circuit 40 as voltage pulses by way of the isolation capacitance 48.

The switching component 20 also has a main driver 50, which applies electrical signals to the driver circuits 40, 40', 40" when the control unit 16 is activated by way of the activation line 22. The signal inputs of the driver circuits 40, 40', 40" are connected directly to one another. The signal inputs of the driver circuits 40, 40', 40" are connected to an output of the main driver 50.

The main driver 50 applies a switching voltage between the signal inputs of the driver circuits 40, 40', 40" and the second control contact 34 or power contact 38" of the last of the field effect transistors 30". The switching voltage is approx. 16 V during a switch-on operation. The application of the switching voltage generates a first voltage and current pulse through the isolation capacitance 48. The Zener diode becomes conducting upstream of the protective diode 46 and transfers charge to the first control contact 32 of the associated field effect transistor 30. This renders the field effect transistor 30 conducting. Effectively the field effect transistors 30, 30', 30" are rendered conducting one after the other, starting with the last field effect transistor 30" so the switching component 20 becomes conducting. A switch-on delay between the field effect transistors 30, 30', 30" is negligible compared with a switching frequency in the region of up to several hundred MHz.

During a switch-off operation the switching voltage is reduced to 0 V, with the signal inputs of the driver circuits 40, 40', 40" and of the second power contact 38' of the last field effect transistor 30" being connected in an effectively conducting manner. This generates a second voltage and current pulse through the isolation capacitance 48. The second voltage and current pulse draws some of the charge, which is present on the first control contact 32 of the field effect transistor 30, backward across the Zener diode 44. In the process a voltage drops across the Zener diode 44, being maintained in particular for some time due to an intrinsic capacitance of the Zener diode 44. The voltage dropping across the Zener diode 44 switches the switching element 42 to a conducting state so that a residual charge between the control contacts 32, 34 of the field effect transistor 30 can be quickly reduced. As the second voltage and charge pulse acts simultaneously on all the driver circuits 40, 40', 40" and therefore field effect transistors 30, 30', 30", even if one of the field effect transistors 30, 30', 30" effectively isolates earlier than other field effect transistors 30, 30', 30", reliable switching off can be brought about due to the voltage of the Zener diode 44, which keeps the switching element 42 conducting, this taking place essentially simultaneously for each of the field effect transistors 30, 30', 30".

The switching components 20, 20' have the same structure. Alternatively it is conceivable for at least one of the switching components 20, 20' to be constructed on field effect transistors which have positive majority change carriers, with other elements and internal wiring being adjusted accordingly. It is also conceivable for a driver circuit 40" to be dispensed with for the last of the field effect transistors 30". It is further conceivable for the main driver 50 of the switching component 20 to be integrated in the control unit 16.

The elements of the driver circuits 40, 40', 40" and the field effect transistors 30, 30', 30" are also configured as separate components. The field effect transistors 30, 30', 30" and the components of the driver circuits 40, 40', 40" are arranged individually adjacent to one another on an electronics board and connected to one another accordingly by this means. Depending on the structural elements selected the headroom of the fitted board can be less than 1 cm or even less than 0.5 cm. The distributed arrangement of the elements means that air cooling by way of simple air slots is sufficient, it being possible to dispense with a fan which in turn can reduce noise. If separate components are used to construct the switching components 20, 20', primarily if individual field effect transistors are used, it is essentially possible to achieve a design of comparable cost or one that is even more economical. The fact that the board surface required may be larger than with a conventional solution using IGBTs can essentially be compensated for by the fact that no surface is required for a fan and cooler unit. In order to avoid expensive cooling of a rectifier block for the energy supply 18, it is further proposed that this should also be constructed from separate components instead of from a single compact component. Alternatively it is conceivable to use an inventive switching component 20, 20' in a supply circuit configured as an alternating current to alternating current rectifier, it being possible then to dispense with a rectifier block that requires cooling.

Figure 5:
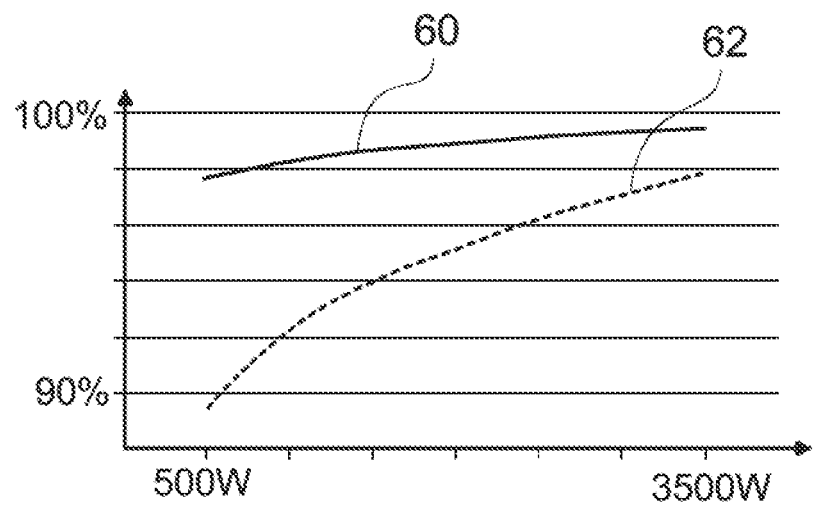
FIG. 5 shows a schematic diagram of an efficiency comparison of an inventive cooktop apparatus with an equivalent design with IGBTs.

FIG. 5 shows an efficiency comparison of a power-dependent efficiency 60 of a supply circuit 13 equipped with inventive switching components 20, 20' according to FIG. 2, with a power of the heating element 14 being used as a reference, with a power-dependent efficiency 62 of a supply circuit equipped with conventional IGBTs as in FIG. 2. A clear increase in efficiency can be achieved compared with a conventional design with IGBTs. An efficiency increase of around 8% can be achieved particular for low powers of the heating element 14, of for example 500 W. An efficiency increase of around approx. 2% can still be achieved for high powers of the heating element 14 around 3000 W.

As the number of field effect transistors 30, 30', 30" used for each switching component 20, 20' increases, an effective resistance of the switching component 20, 20' in the conducting state decreases. A ratio of the resistance of a single one of the field effect transistors 30, 30', 30" to the resistance of the switching component 20, 20' corresponds to the 1.6th power of the number of field effect transistors 30, 30', 30" connected in series.

The invention claimed is:

1. A switching component, comprising:
   a main driver that applies an electrical signal to a plurality of driver circuits;
   a series circuit of a plurality of field effect transistors;
   each driver circuit is associated with one of the plurality of field effect transistors, each driver circuit having at least one switching element, which short circuits two control contacts of the associated field effect transistor in at least one operating state to simultaneously switch off each of the associated field effect transistors.

2. The switching component of claim 1, constructed in the form of a domestic appliance switching component.

3. The switching component of claim 1, wherein the plurality of field effect transistors are configured as MOSFETs.

4. The switching component of claim 1, wherein each driver circuit has at least one Zener diode, which is arranged between control contacts of the switching element.

5. The switching component of claim 1, wherein each driver circuit has at least one protective diode, which reduces a voltage drop across the associated field effect transistor when at least one of the field effect transistors is switched off.

6. The switching component of claim 5, wherein each driver circuit has at least one Zener diode, which is arranged between control contacts of the switching element, said protective diode and said Zener diode being connected in series.

7. The switching component of claim 5, wherein each driver circuit has at least one isolation capacitance, which is arranged parallel to the protective diode.

8. The switching component of claim 1, wherein elements of the driver circuit and the field effect transistors are configured as separate components.

9. A domestic appliance apparatus, comprising at least one switching component including:
   a main driver that applies an electrical signal to a plurality of driver circuits,
   a series circuit of a plurality of field effect transistors, each driver circuit being associated with one of the plurality of field effect transistors, each driver circuit having at least one switching element, which short circuits two control contacts of the field effect transistor in at least one operating state to simultaneously switch off each of the associated field effect transistors.

10. The domestic appliance apparatus of claim 9, constructed in the form of a cooktop apparatus.

11. The domestic appliance apparatus of claim 9, wherein the plurality of field effect transistors are configured as MOSFETs.

12. The domestic appliance apparatus of claim 9, wherein each driver circuit has at least one Zener diode, which is arranged between control contacts of the switching element.

13. The domestic appliance apparatus of claim 9, wherein each driver circuit has at least one protective diode, which reduces a voltage drop across the associated field effect transistor when at least one of the field effect transistors is switched off.

14. The domestic appliance apparatus of claim 13, wherein each driver circuit has at least one Zener diode, which is arranged between control contacts of the switching element, said protective diode and said Zener diode being connected in series.

15. The domestic appliance apparatus of claim 13, wherein each driver circuit has at least one isolation capacitance, which is arranged parallel to the protective diode.

16. The domestic appliance apparatus of claim 9, wherein elements of each driver circuit and the associated field effect transistors are configured as separate components.

17. The domestic appliance apparatus of claim 9, wherein the switching component is part of an induction heating circuit.

18. A domestic appliance, comprising at least one domestic appliance apparatus including at least one switching component having a series circuit of a plurality of field effect transistors, and a plurality of driver circuits, each driver circuit associated with one of the plurality of field effect transistors, each driver circuit having at least one switching element, which short circuits two control contacts of the field effect transistor in at least one operating state to simultaneously switch off each of the associated field effect transistors.

19. The domestic appliance of claim 18, constructed in the form of a cooktop.

* * * * *